(12) United States Patent
Daughton et al.

(10) Patent No.: US 7,468,664 B2
(45) Date of Patent: Dec. 23, 2008

(54) ENCLOSURE TAMPER DETECTION AND PROTECTION

(75) Inventors: James M. Daughton, Eden Prairie, MN (US); James G. Deak, Eden Prairie, MN (US)

(73) Assignee: NVE Corporation, Eden Prairie, MN (US)

(*) Notice: Subject to any disclaimer, the term of this patent is extended or adjusted under 35 U.S.C. 154(b) by 7 days.

(21) Appl. No.: 11/788,616

(22) Filed: Apr. 20, 2007

(65) Prior Publication Data

US 2008/0042834 A1 Feb. 21, 2008

Related U.S. Application Data

(60) Provisional application No. 60/793,569, filed on Apr. 20, 2006.

(51) Int. Cl.
*G08B 13/24* (2006.01)

(52) U.S. Cl. .................. 340/551; 340/561; 340/565; 340/568.1; 340/643

(58) Field of Classification Search ......... 340/550–551, 340/561, 565, 568.1, 571, 572.6, 686.6, 545.2
See application file for complete search history.

(56) References Cited

U.S. PATENT DOCUMENTS

| | | | | |
|---|---|---|---|---|
| 3,971,916 A | | 7/1976 | Moreno | |
| 4,401,944 A | * | 8/1983 | Narimatsu et al. | 324/207.21 |
| 4,860,351 A | * | 8/1989 | Weingart | 713/194 |
| 5,117,457 A | * | 5/1992 | Comerford et al. | 713/194 |
| 5,159,629 A | | 10/1992 | Double et al. | |
| 5,233,505 A | * | 8/1993 | Chang et al. | 361/785 |
| 5,602,381 A | | 2/1997 | Hoshino et al. | |
| 5,675,319 A | * | 10/1997 | Rivenberg et al. | 340/550 |
| 5,790,670 A | | 8/1998 | Bramlett | |
| 5,910,774 A | | 6/1999 | Capriotti et al. | |
| 6,233,339 B1 | | 5/2001 | Kawano et al. | |
| 6,264,108 B1 | | 7/2001 | Baentsch | |
| 6,310,549 B1 | | 10/2001 | Loftin et al. | |
| 6,462,979 B2 | * | 10/2002 | Schlosser et al. | 365/158 |
| 6,501,390 B1 | | 12/2002 | Chainer et al. | |
| 6,592,034 B1 | | 7/2003 | Millard et al. | |
| 6,753,775 B2 | | 6/2004 | Auerbach et al. | |
| 6,774,807 B1 | | 8/2004 | Lehfeldt et al. | |
| 6,778,083 B2 | | 8/2004 | Auerbach et al. | |
| 6,784,796 B2 | * | 8/2004 | Johnston et al. | 340/568.1 |
| 6,891,474 B1 | | 5/2005 | Fletcher | |
| 2001/0030839 A1 | * | 10/2001 | Zhong et al. | 360/314 |
| 2001/0033012 A1 | | 10/2001 | Kömmerling et al. | |
| 2003/0212871 A1 | | 11/2003 | Suzuki et al. | |
| 2004/0134994 A1 | | 7/2004 | Zaba et al. | |
| 2005/0047543 A1 | | 3/2005 | Sandstrom | |
| 2005/0051624 A1 | | 3/2005 | Kipp et al. | |

(Continued)

*Primary Examiner*—George A Bugg
*Assistant Examiner*—Son M Tang
(74) *Attorney, Agent, or Firm*—Kinney & Lange, P.A.

(57) ABSTRACT

A tamper detecting enclosure arrangement for enclosures containing an interior space in which a protected item is positioned having a magnetoresistive sensing memory storage cell positioned in or near the protected item in the enclosure having a two state offset magnetoresistance versus externally applied magnetic field. A magnet is positioned at a selected separation distance from the magnetoresistive sensing memory storage cell to thereby provide a magnetic field about the magnetoresistive sensing memory storage cell if said enclosure has not been opened in such a manner as to result in substantially increasing said separation distance.

18 Claims, 3 Drawing Sheets

U.S. PATENT DOCUMENTS

2005/0066168 A1 3/2005 Walmsley
2005/0151777 A1 7/2005 Silverbrook
2006/0092020 A1* 5/2006 Wilson et al. ............... 340/547
2006/0108668 A1 5/2006 Knudsen
2006/0146597 A1 7/2006 Lenssen et al.
2006/0179490 A1 8/2006 Lenssen et al.
2008/0088996 A1* 4/2008 Bonvalot et al. ............. 361/78

* cited by examiner

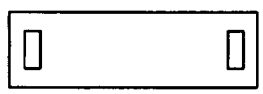
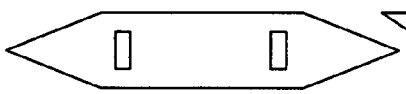
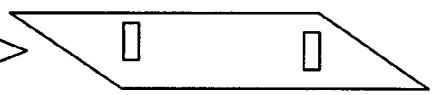
Fig. 5A          Fig. 5B          Fig. 5C
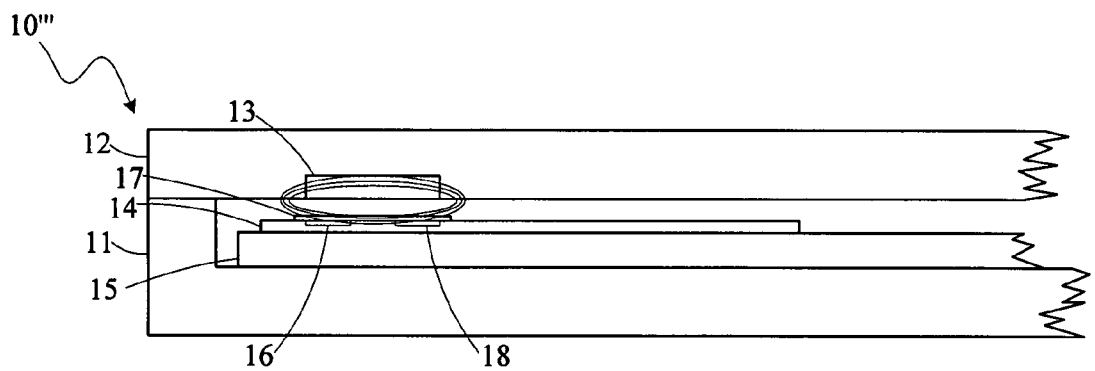
Fig. 6
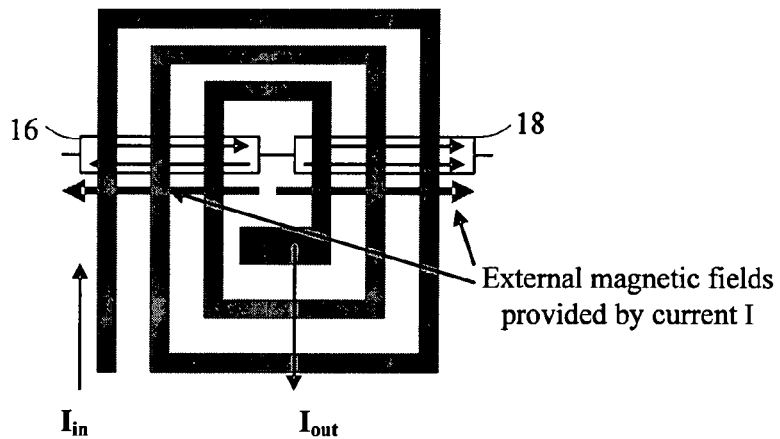
Fig. 7
External magnetic fields provided by current I
$I_{in}$          $I_{out}$
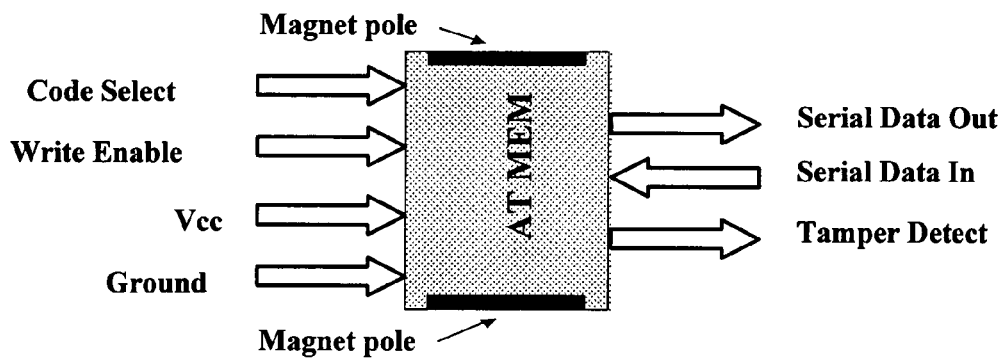
Fig. 8

ENCLOSURE TAMPER DETECTION AND PROTECTION

CROSS-REFERENCE TO RELATED APPLICATION

This application claims the benefit of Provisional Patent Application No. 60/793,569 filed Apr. 20, 2006 titled "ENCLOSURE TAMPER DETECTION AND PROTECTION".

BACKGROUND

The present invention relates to enclosures desired to be secure against having the contents thereof revealed as a result of tampering therewith that results in intrusion therein or to the removal of some or all of the those contents therefrom, or both, and, more particularly, to magnetic devices for providing such security.

Various kinds of enclosures are used to store various kinds of items that an owner or user wants secure against being revealed to, or removed by, others especially without the owner or user gaining knowledge of such revelations or removals having occurred. One example is an enclosure for keeping selected data stored in a computer or other device memory secret. To do so, such data must be protected against its being extracted from the memory, or from being intercepted from transmissions thereof during use, in a manner which would result in the contents thereof being revealed. Typically, in aid of such an effort, the data is encrypted before storage in the memory or before transmission to better protect the contents thereof from being revealed.

Such arrangements require the use of encryption and decryption keys as the basis for encrypting the data and for decrypting the coded data result which are often kept in nonvolatile memories in the form of integrated circuits stored in an enclosure. These enclosures are subject to many kinds of attacks by those interested in gaining unauthorized access to the contents of the data stored therein. Thus, there is a desire to provide an arrangement for detecting any intrusions into such enclosures with little additional apparatus and, in at least some situations, to erase such stored data from the nonvolatile memory upon an intrusion.

SUMMARY

The present invention provides a tamper detecting enclosure arrangement for enclosures containing an interior space in which a protected item is positioned to which access is to be denied absent providing a subsequent indication that such an access has occurred, the arrangement having a magnetoresistive sensing memory storage cell positioned in or near the protected item in the enclosure having a magnetoresistance versus externally applied magnetic field characteristic with two states of differing resistive values each reached from that other by an externally applied magnetic field having a magnitude change exceeding a corresponding one of a pair of relatively small transition field value intervals each having externally applied magnetic field values occurring therein of a common field direction but with those externally applied magnetic field values occurring therein differing in magnitudes from those in that other transition field value interval. A magnet is positioned at a selected separation distance from the magnetoresistive sensing memory storage cell to thereby provide a magnetic field about the magnetoresistive sensing memory storage cell if said enclosure has not been opened so as to result in substantially increasing said separation distance.

BRIEF DESCRIPTION OF THE DRAWINGS

FIGS. 5A, 5B and 5C show top views of components useable with an embodiment of the present invention, FIG. 6 shows a side view of a portion of an alternative embodiment of the present invention, FIG. 7 shows a top view of components useable with an embodiment of the present invention, and FIG. 8 shows a top view of an alternative embodiment of the present invention.

DETAILED DESCRIPTION

An antitampering device is provided as primarily a magnetic memory having one or more data storage cells that are sensitive to exteriorly applied magnetic fields in such a way as to guarantee a measurable change in magnetic states of the cells as a result of any sufficient intrusion to provide access to that which is being protected by those cells. The arrangements described below all use magnetoresistance changes in one or more sensing memory storage cells in the antitampering device. Detection of the intrusion is accomplished even though the antitampering device is not provided with any operating electrical power which is a decided advantage in many situations. These antitampering devices can be provided so as to assure that information that was originally stored is completely erased and so be undetectable after the tampering sensed by the antitampering device.

The antitampering devices described below responds when the absolute magnetic field about them becomes relatively small but does not react when such magnetic fields are maintained relatively large, such responses being obtained from sensing memory storage cells in the device having an asymmetrical electrical resistance versus applied magnetic field characteristic. This kind of antitampering device can provide only detection of tampering with the pertinent enclosure, or it can provide such tampering detection and thereafter disable the protected system so that so that proprietary information also kept in the enclosure is not revealed.

Figure 1A:
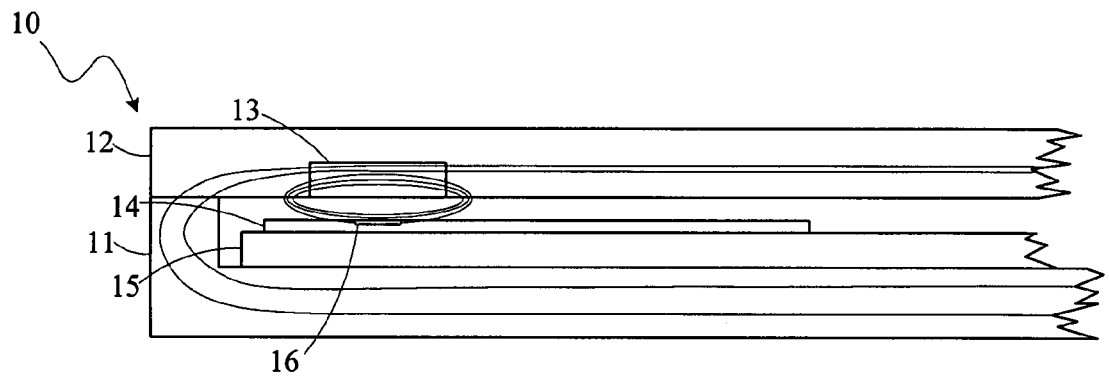
FIGS. 1A, 1B and 1C show schematic diagrams with representational cross-sectional side views of an embodiment of the present invention.

An integrated circuit chip, for example, having a tampering detection magnetoresistive sensing memory storage cell or cells therein, and also containing common operating memory cells in which is stored data to be protected, can be positioned in a protected enclosure, 10, having a receptacle, 11, and a cover, 12, as shown (all just partially shown) in the cross section side view in the representative schematic diagram of FIG. 1A, or the chip can be contained in an integrated circuit chip housing of nonmagnetic material positioned in enclosure 10. A permanent magnet, 13, is positioned in enclosure cover 12. Such a cover is provided to deny unwanted access by others to the interior of receptacle 11 in enclosure 10, and so to such an integrated circuit chip, 14, on a printed circuit board, 15, positioned therein, without such intruders leaving an indication of that intrusive access, but still allowing nondestructive access to this interior by a rightful possessor if needed (also with an indication of such an access intrusion).

At least one tampering detection magnetoresistive sensing memory storage cell, 16, is provided in integrated circuit 14.

Figure 1B:
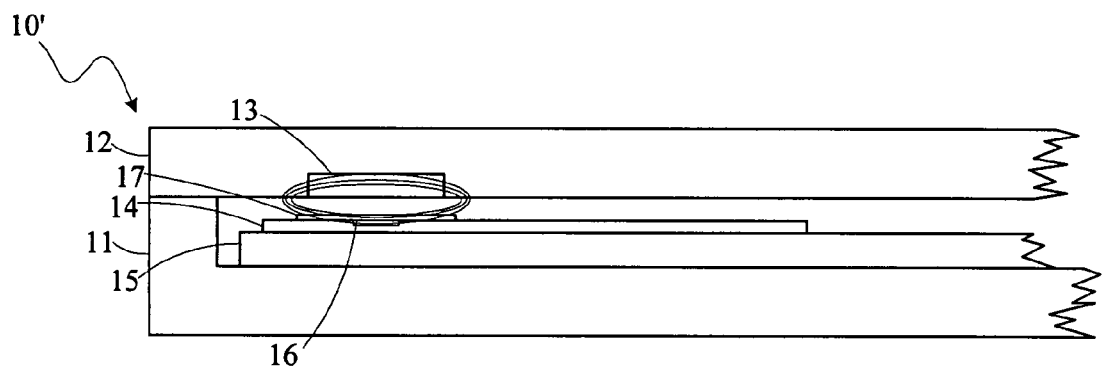
Figure 1C:
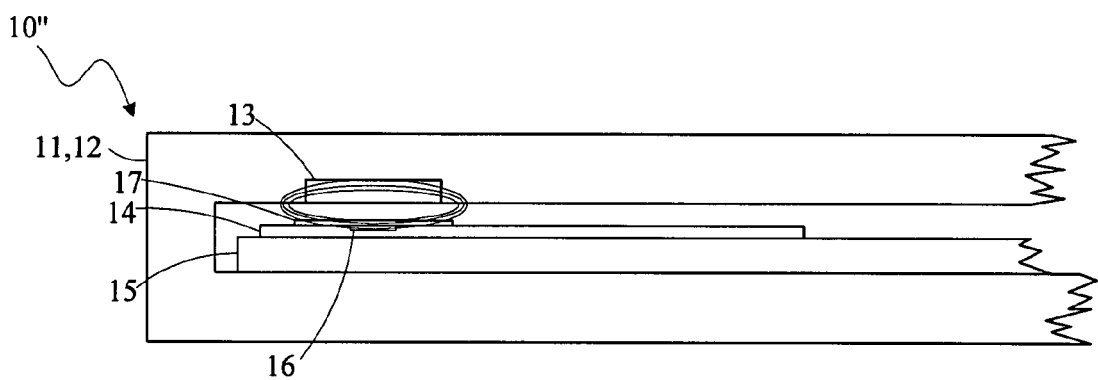

The outer sides of the enclosure, including the cover, can have some permeable magnetic material therein or thereon to shield the interior of the enclosure from external magnetic fields but small enough permeability and volume to still allow the field of permanent magnet 13 to substantially affect the tampering detection magnetoresistive sensing memory storage cell or cells in chip 14. More typically in another protected disclosure, 10', shown in FIG. 1B, receptacle 11 can be of a nonmagnetic material and a highly permeable magnetic material sheet portion, 17, is instead fabricated directly on integrated circuit chip 14 closely adjacent to the tampering detection magnetoresistive sensing memory storage cell 16, or cells, to shield them from magnetic fields. Such a permeable sheet portion thereby requires a large magnetic field be provided by magnet 13 in cover 12 so as to have the ability to substantially affect that cell or cells, and such a large supplied field will leave any external magnetic fields encountered being relatively insignificant to the operation of those cells at least within a selected range of external fields magnitudes. In a further alternative protected disclosure, 10", shown in FIG. 1C, enclosure 10 is provided with receptacle 11 and cover 12 formed as a single integrated structure, 11,12, with no nondestructive access intended to be provided to integrated circuit chip 14 (formed again with highly permeable magnetic material sheet portion 17 fabricated directly thereon) previously positioned therein prior to the provision of, or the sealing of, enclosure 10 thereabout except through electrical interconnections to that chip provided extending through the walls of enclosure 10. Enclosure 10" can instead be formed as a potting compound formed about at least a portion of integrated circuit 14 with cell 16, permeable layer portion 17, and magnet 13 all in the potting mass.

In such arrangements, permanent magnet 13 provides a bias magnetic field to the protected chip in receptacle 11 of enclosure 10, including the tampering detection magnetoresistive sensing memory storage cell or cells in chip 14 therein, so long as that enclosure is in the untampered condition in which cover 12 has remained in place in the enclosure to thereby deny access to the interior thereof, i.e. to the interior of receptacle 11, and the structural walls of enclosure 10 have not been breached. In contrast, permanent magnet 13 provides no bias magnetic field to the chip after tampering has occurred with respect to enclosure 10 that is sufficient to remove cover 12, and so permanent magnet 13, from the remainder of that enclosure or has otherwise separated magnet 13 and chip 14 so that no significant magnetic field from that magnet remains about that chip. Tamper detection in this configuration requires that the antitampering magnetoresistive sensing memory storage cell or cells have a magnetoresistance versus applied magnetic field characteristic which is offset with respect to the applied magnetic field axis as shown in the graph provided in FIG. 2.

There, the antitampering magnetoresistive sensing memory cell magnetoresistance versus the sensor cell applied magnetic field characteristic is offset by 50 Oe along the positive applied field axis, and a permanent magnet is indicated to be providing a positive magnetic bias field having a value of 50 Oe. Detection of tampering with the enclosure takes place, for example, by having a maximum cell magnetoresistance value as a binary state "1" that is initially set in the cell using the chip data storage circuitry, and then having a minimum cell magnetoresistance value as a binary state "0" state that is subsequently found in the cell when it is later interrogated to check on whether an intrusion has occurred. A binary state "0" state determined to be present in the cell by the cell data retrieval circuitry will have occurred as a result of enclosure cover 12 with permanent magnet 13 having been removed by the tampering activity to thereby gain access to the interior of enclosure 10 containing protected chip 14 including the tampering detection magnetoresistive sensing memory storage cell or cells.

In the absence of occurrences of external random direction magnetic fields affecting the antitampering sensing memory storage cell, the device is stable in having the smaller value switching threshold always remain between a slightly positive value field and a field of a value equal to 50 Oe. If magnet 13 is moved away from the sensing memory cell, then the bias magnetic field about the antitampering memory storage cell would be zero and the cell would go to the low resistance, or "0", state. For the characteristic shown in FIG. 2, the sensor cell could withstand an external applied random direction magnetic field with a component along the cell sensitive axis of a value up to 25 Oe and still detect a tamper with the enclosure that was sufficient to remove cover 12 from enclosure 10.

Figure 2:
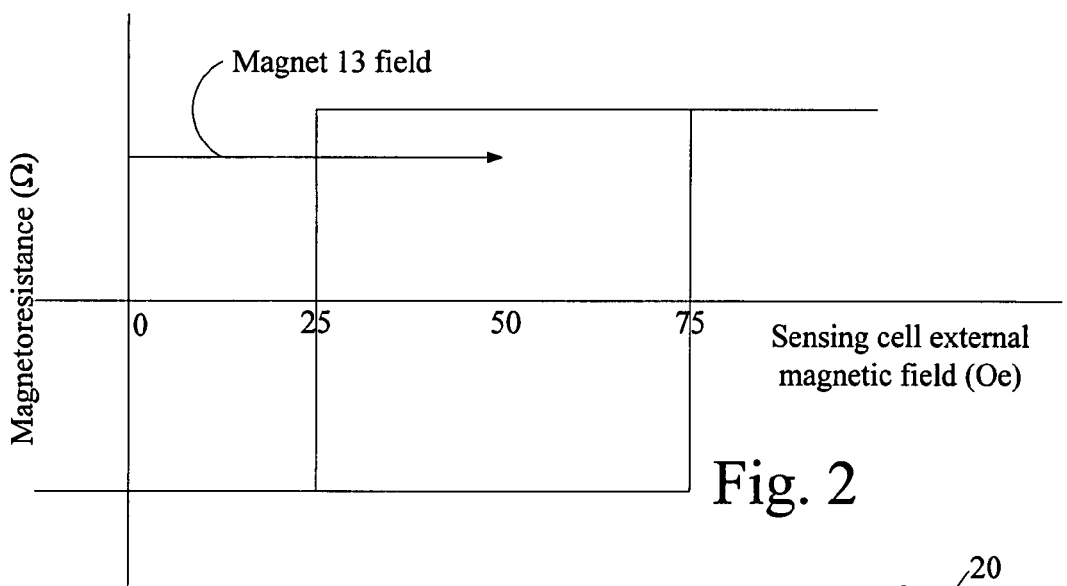
FIG. 2 shows a graph of a characteristic behavior of a component useable with an embodiment of the present invention.

Magnetoresistive memory storage cells having a relatively "square" magnetoresistance versus applied magnetic field characteristics like that shown in FIG. 2 are commonly observed in cells based on either "spin valve" or "spin tunneling" devices. Such characteristics provide relatively abrupt switching between, or transitions to, alternative binary resistance value states, that is, the storage cell switches between a "0" state and a "1" state, or vice versa, over a very small range, or magnitude interval, of values of an externally applied magnetic field. Layer diagrams representing basic schematic representations of such devices are shown in FIG. 3, a spin valve device being shown in FIG. 3A and a magnetic tunneling junction device, or spin dependent tunneling device, being shown in FIG. 3B.

Figure 3A:
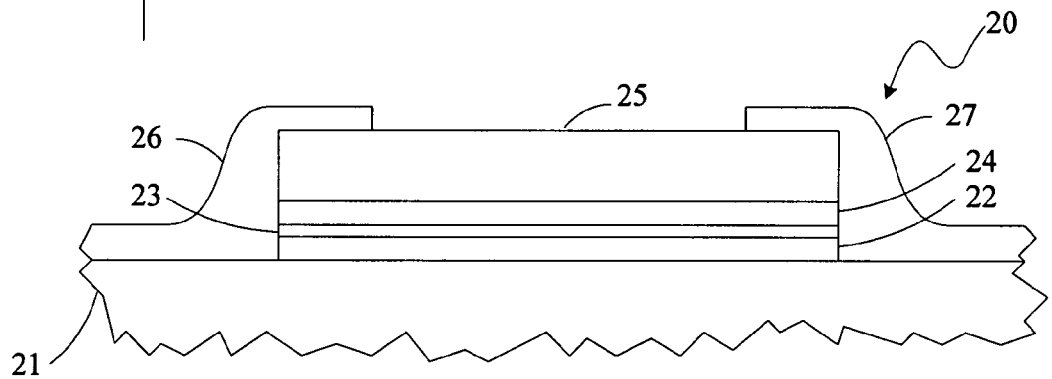
FIGS. 3A and 3B show side views of components useable with an embodiment of the present invention.

In FIG. 3A, a spin valve device, 20, is supported on a substrate, 21, through having a first ferromagnetic material layer, 22, or "free" layer, shown on that substrate and supporting a layer of copper, 23, thereon which in turn supports thereon a second ferromagnetic material layer, 24, or "pinned" layer. An antiferromagnet, 25, is provided on pinned layer 24, and a pair of electrodes, 26 and 27, with each member of the pair at a corresponding opposite end of the foregoing sequence of layers provides the electrical interconnections for introducing current flows therebetween parallel to the main extent of the layer sequence.

Figure 3B:
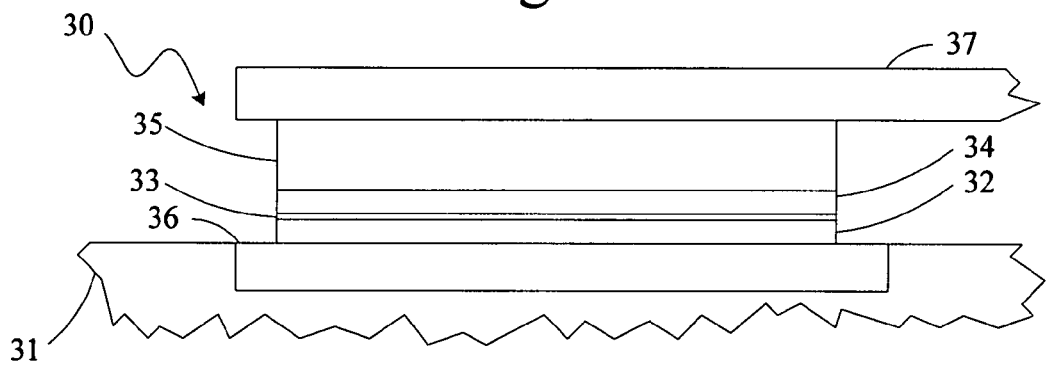

A spin dependent tunneling device, 30, in FIG. 3B is supported on a substrate, 31, through having a first ferromagnetic material layer, 32, or "free" layer, shown on that substrate and supporting a layer of aluminum oxide, 33, thereon which in turn supports thereon a second ferromagnetic material layer, 34, or "pinned" layer. An antiferromagnet, 35, is provided on pinned layer 34, and a pair of electrodes, 36 and 37, with each member of the pair at a corresponding opposite side of the foregoing sequence of layers provides the electrical interconnections for introducing current flows therebetween perpendicular to the main extent of the layer sequence.

In both FIGS. 3A and 3B, antiferromagnetic layers 25 and 35 are each provided to maintain the magnetization direction of, or "pinning", of the corresponding one of pinned layers 24 and 34 so that the magnetization direction thereof does not react, or change significantly, in response to the expected values of the operating magnetic fields to be used in operating these devices. Corresponding "free" layers 22 and 32 are each relatively free to react to expected values of the operating magnetic fields through rotating their magnetization directions. Both of spin valve device 20 and magnetic tunnel junction 30 of FIGS. 3A and 3B, respectively, can be provided so as to have magnetoresistance versus applied magnetic field characteristics that are closely approximated by the "square" loop shown in the graph of FIG. 2 provided that the corresponding free layers are homogeneous and relatively smooth. The degree of offset in such characteristics along the applied field axis depends on several factors:

a) Orange Peel Coupling (Nèel Coupling) bias fields. These bias fields arise from the roughness of the magnetic film layers surfaces and bias the free layer nearly always in the direction of the magnetization in the pinned layer, b) Stray magnetic fields from the pinned layers. When the device deposited film layers are subsequently etched into oblong shapes as is usual for the resulting devices, there can be an excess of magnetic field (magnetization times thickness) in the pinned layer compared with the magnetic field (magnetization times thickness) in the free layer. If this is the case, the free layer would be biased in the opposite direction from the direction of magnetization in the pinned layer, and c) Indirect exchange coupling between the pinned layer and the free layer. Such coupling may bias the free layer of a spin valve either in the same or in opposite directions compared to the pinned layer depending on the intermediate copper layer thickness.

At a critical thickness of copper in layer 23 of about 19 Å, orange peel coupling and indirect exchange coupling can offset one another in basic spin valve configuration 20 of FIG. 3A to provide a low offset characteristic as required for some kinds of tampering cells. Providing a more complex pinning layer for magnetic tunneling junction structure 30 of FIG. 3B can be done so as to also provide a low offset characteristic.

Increasing surface roughness increases the orange peel coupling for either magnetic tunneling junction device structure 30 or spin valve device structure 20. In this manner tamper cells with higher offsets in their characteristics can be obtained.

In addition, either of the devices shown in FIGS. 3A and 3B can be biased to form an characteristic offset by setting the magnetization in other device structures positioned near to the FIGS. 3A and 3B devices to be biased. That is, a spin valve or magnetic tunnel junction cell can be placed between two permanently magnetized bodies or masses to provide a biasing magnetic field in the cell. The stray fields from the magnetizations in those devices together provide a resulting magnetic bias field, as shown in a representative configuration in FIG. 4, thus giving selectively either a small cell characteristic offset value or a relatively large characteristic offset value depending on the magnitude of the fields provided by those masses.

Figure 4:
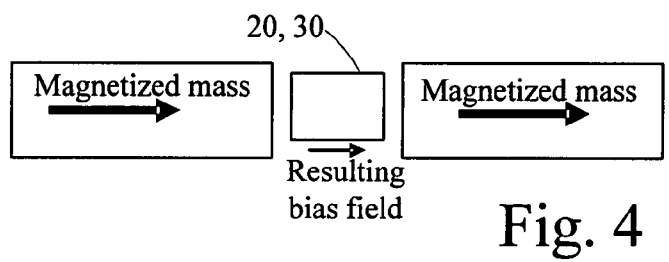
FIG. 4 shows a top view of components useable with an embodiment of the present invention.

The configuration shown in FIG. 4 can be implemented in alternative manners. In one manner, the magnetized masses on either side of a antitampering magnetoresistive sensing memory storage cell could be ferromagnetic films pinned by antiferromagnets in the direction shown. The magnetized films importantly must not change significantly in the presence of an external field, i.e. they must behave like permanent magnets.

Antitampering magnetoresistive sensing memory storage cells, even though similarly fabricated, can switch at considerably different magnetic field values as the magnetization directions of the magnetoresistive material therein are switched back and forth, and this is a problem because uniformity of switching threshold fields is important for many antitamper configurations. A primary cause for this effect is the existence of "reverse magnetic domains" in the magnetic material in the cell free layer leading to the cell switching by domain wall motion rather than by domain rotation. FIG. 5 shows some top views of alternative layout configurations for a spin valve cell with the cell layout in FIG. 5A having blunt ends, the cell layout in FIG. 5B having symmetrically tapered ends, and the cell layout in FIG. 5C having asymmetrically tapered ends. Electrical circuitry contacts to the cells are represented by open rectangles within the outer edges of the cells in each of these figures.

When magnetic fields external to such cells are applied along the long axis of the cell structures in FIG. 5, the cell structure in FIG. 5A cannot avoid having edge domains form near the blunt ends thereof, and erratic external magnetic field switching threshold values are the corresponding usual result. In cell structures 5B and 5C, the most onerous of the reverse magnetization edge domains are eliminated in those cells with the geometries shown therefor, and so more consistent magnetic field switching threshold values are achieved.

Sensing currents are passed through cells using the electrical circuit contacts therein as the basis for determining the electrical resistance thereof, and so to thereby obtain which resistive value logic state the cell is presently in, and such passing of current through spin valves also has the effect of reducing the cell magnetic field switching threshold value magnitudes. Forming the cell electrical circuitry contacts must be done so as to avoid etching or diffusion into the magnetic film layer as discontinuities in the film can serve as nucleation points for the formation of reverse domains. The cell structures shown in FIGS. 5B and 5C are desirable when the width of the spin valve devices or the magnetic tunnel junction devices is on the order of a few microns.

For devices smaller than 1.0 μm in length, consistent external magnetic field switching threshold values are more likely to be provided by some shapes over others, and magnetic tunnel junction device structures are more favorable in these regards than are spin valve device structures. Asymmetrically shaped cells such as "kidney-shaped" cells or trapezoidal shaped cells have demonstrated magnetic field switching threshold values with improved consistency.

As shown in the foregoing, selected initial cell states, i.e. data, are stored in an antitampering magnetoresistive sensing memory storage cell, or possibly a group of such cells, in such a manner that, for a protected enclosure which has not been sufficiently tampered with to gain access to the interior thereof, results in the initially stored cell states, or the stored data, remaining unchanged. The detection of an intrusion sufficient to gain access to the interior of the protected enclosure involves having some mechanism present with the enclosure that leads to the magnetic field about the antitampering memory storage cell or cells changing when an intrusion occurs and, correspondingly, the antitampering memory storage cell, or at least some of a group of such cells, must responsively change to a state different than the initial state or states thereof if the occurrence of such an intrusion is to be recorded therein. Furthermore, simply returning the enclosure associated magnetic field changing mechanism to its original state must not reset the antitampering memory storage cell or cells to their initial states because there would then be no record of the intrusion in those cells.

An arrangement which allows differential measurement of antitampering memory storage cell resistance values for checking on the relative status of cell states in determining the occurrences of recordings of any serious intrusions into the enclosure, rather than measuring the absolute resistance value difference between different cell states to do so, as was indicated above, is shown in FIG. 6. Thus, there is shown in that figure a slightly altered enclosure arrangement, 10''', (just partially shown) with again therein monolithic integrated circuit chip 14 on printed circuit board 15 (just partially shown) having antitampering magnetoresistive sensing memory storage cell 16 therein and permeable material shield 17 closely adjacent thereto. In this instance there is a further with representation of another antitampering magnetoresistive sensing memory storage cell, 18, provided in integrated circuit 14 over both of which is provided highly permeable layer potion 17. Permanent magnet 13 is provided in cover 12 (just partially shown) at the interior surface thereof across from permeable layer potion 15 adjacent to antitampering magnetoresistive sensing memory storage cells 16 and 18, and provides a magnetic field just sufficient to move the offsets in the magnetoresistance versus applied magnetic field characteristic of each to be symmetrical about the zero value of externally applied magnetic fields. Enclosure 10''' has cover 12 (just partially shown) that goes over receptacle 11 (just partially shown) with a bottom and sides formed about an interior space, and the sides meet the cover to thereby deny access to printed circuit board 15 positioned in this interior space with chip 14 therein when cover 12 with magnet 13 embedded therein is in place against the upper ends of those receptacle sides. This arrangement, then, is much like that of FIG. 1 except that two antitampering magnetoresistive sensing memory storage cells 16 and 18 are shown provided in chip 14 that is itself separated from the item being protected, i.e. printed circuit board 15 and the other circuit element provided thereon.

If cell 16 has an initial "1" state stored therein and cell 18 has an initial "0" state stored therein through, in both instances, the use of data storage circuitry in the chip containing an on-chip coil, then these cells will retain these stored states under normal conditions with the cover and the magnetic attached thereto being in place against the base. Furthermore, if the cells are fabricated to be well matched and the cell resistances are measured with these initial state conditions, there will be a resistance difference measured between them. If, on the other hand, the cover is removed from the base because of tampering, and thus from being over the enclosure interior space so as to also remove the magnetic material shield from that space, then both cells will be in a "0" state in accord with the description associated with FIG. 2 above. Such a tampering leading to the removal of the cover can then be detected by measuring the resistances of each cell which will, in this circumstance, be substantially equal for well matched cells.

However, if these cells are fabricated to be well matched the application of a uniform external magnetic field to them jointly will not result in one of the cells storing an initial state therein that is different state from that of the other. Thus, providing on-chip coils in the storage circuitry in chip 14, as represented in the top view of a portion of that chip in FIG. 7, allows the setting of different initial states in these cells to be readily performed. Shown in that figure is a top view of a flat coil in the circuit interconnection metallization positioned across the two spin valve multi-layer cells 16 and 18 formed in chip 14. Electrical current beginning at $I_{in}$ flows through the coil coming out at $I_{out}$ and creates a magnetic field to magnetize one of the cells in the "1" state and the other cell in the "0" state.

When an external magnetic field less than the magnetic field switching threshold of either device is applied along the long dimension of the cells jointly both cells will then be magnetized in the same direction. Such a small field with respect to these cells occurs when the cover is removed from the enclosure, or when circuit board is removed from the enclosure in some other manner, as the magnet material shield will then no longer shield the cells from the magnetic field provided by the permanent magnet. That absence of a field through both cells will switch them both into the same state, and so the tampering with the enclosed the circuit board can be detected by noting the cell states even if the cover or the board or both have been returned to their initial positions. These subsequent measurements comparing the resistances of the two cells will thus show them to be about equal resistance and so in the same states, and thus a previous tampering is thereby detected.

Rather than just one, two or a few antitampering memory storage cells being provided in a chip as a basis for providing an indication that the enclosure in which that chip is contained has been tampered with sufficiently to change the states of at least some of these cells from the states initially set into those cells, an entire magnetoresistive memory cell monolithic integrated circuit chip could be formed with such cells with this chip being positioned in the interior space of the enclosure. Then a tampering sufficient to remove the enclosure cover or to remove that chip from the enclosure in some other manner would result in the entire contents of the memory chip being erased because all of the cells in the memory would be set to the same state after such a tampering. Since microprocessor operated systems, or microprocessor enabled systems, are operated or enabled in a manner determined by the states initially set into these cells in programming the system to provide the capabilities intended for it by the programmer, or in any subsequent such programmings, such an erasure resulting from such tampering will prevent operating or enabling the associated system until the memory is reprogrammed. Memory cells based on spin valve devices or spin tunneling junction devices have an advantage over other kinds of magnetic memories because the erasure of the data, or states, initially stored therein is complete, i.e. the data cannot be reconstructed even following very careful analysis of the erased memory.

Such a memory is represented in FIG. 8. A Code Select input is provided for selecting a particular stored code register arrangement for retrieval of the data stored therein or for storing some alternative data therein through modifying the previously set states in some or all of the cells. The code sequences could range from as few as 1 bit to as many as 10 kbits in length, and would be retrieved or stored through serial data input and output pins. A Tamper Detect output is provided as the point to obtain a signal indication that an enclosure tampering event has been detected. Such a tampering indication signal could be used to activate certain analog hardware or as a microprocessor interrupt in a microprocessor based system. An algorithm for generating a Tamper Detect output tampering occurrence signal could be based on the occurrence of some desired fraction of the cells in the selected code register arrangement all being in a common state resulting from all being set in the direction of magnetic field generated by the on-chip magnet, or based on a comparison between two register arrangements. Different versions of such memories or different versions of inputs to select the tamper detect algorithm make this configuration very flexible.

Thus, the device of FIG. 8 provides codewords directing operation or enablement, or both, of the associated system as serial data sequences, or perhaps just representing secret stored information for the user, and the memory is programmed from an input serial data sequence. Input signals to the Code Select input directs the hardware to select one of several codes stored in the secure memory device. A discrete output signal at the Tamper Detect output can be chosen, for example, to go to a high logic state when all of the bits in the selected codeword are the same, i.e. when the magnetizations of the corresponding cells in the memory have all been forced into the same direction by the magnetic field provided by the on-chip permanent magnet as a result of the enclosure cover having been removed from the enclosure base during a tampering. The regions marked Magnet pole at the top and bottom of the memory chip in FIG. 8 are the magnetic poles that protrude through the top of the device encapsulating material much like the poles shown in FIG. 1 although this is not the only magnet configuration possible for this purpose in some of which such poles would not be present.

Although the present invention has been described with reference to preferred embodiments, workers skilled in the art will recognize that changes may be made in form and detail without departing from the spirit and scope of the invention.

The invention claimed is:

1. A tamper detecting enclosure arrangement for enclosures containing an interior space in which a protected item is positioned to which access is to be denied absent providing a subsequent indication that such an access has occurred, said arrangement comprising:

a magnetoresistive sensing memory storage cell positioned in or near said protected item in said enclosure having a magnetoresistance versus externally applied magnetic field characteristic with two states of differing resistive values which are each entered from that other by applying an external magnetic field having a magnitude change exceeding a magnitude difference between a pair of relatively small transition field value magnitude intervals each having externally applied magnetic field values occurring therein of a common field direction but with those externally applied magnetic field values occurring therein differing in magnitudes from those in that other transition field value magnitude interval, and a magnet positioned at a selected initial separation distance from said magnetoresistive sensing memory storage cell to thereby provide a magnetic field of initial magnitudes about said magnetoresistive sensing memory storage cell which magnetic field decreases if said enclosure is opened so as to result in substantially increasing a distance separating said magnet and said magnetoresistive sensing memory storage cell, as a resulting opening separation distance, that is larger than said initial separation distance.

2. The arrangement of claim 1 wherein said enclosure has a receptacle with at least part of said interior space therein and a cover which can be positioned so as to render said interior space surrounded by said enclosure.

3. The arrangement of claim 2 wherein said magnet is positioned in said cover.

4. The arrangement of claim 1 wherein said magnetoresistive sensing memory storage cell is formed in a monolithic integrated circuit positioned in said interior space.

5. The arrangement of claim 1 further comprising a portion of a layer of magnetically permeable material positioned adjacent said magnetoresistive sensing memory storage cell.

6. The arrangement of claim 1 further comprising another magnetoresistive sensing memory storage cell positioned in or near said protected item in said enclosure having a magnetoresistance versus externally applied magnetic field characteristic with two states of differing resistive values which are each entered from that other by applying an external magnetic field having a magnitude change exceeding a magnitude difference between a pair of relatively small transition field value magnitude intervals each having externally applied magnetic field values occurring therein of a common field direction but with those externally applied magnetic field values occurring therein differing in magnitudes from those in that other transition field value magnitude interval.

7. The arrangement of claim 6 wherein said magnetic field of initial magnitudes provided by said magnet is about both said magnetoresistive sensing memory storage cells.

8. The arrangement of claim 7 further comprising a conductor coiled adjacent to both said magnetoresistive sensing memory storage cells such that any electrical current established through said conductor tends to place them in opposite resistive value states.

9. The arrangement of claim 1 wherein said magnetoresistive sensing memory storage cell has a length along a selected direction and a width substantially perpendicular thereto that is smaller in extent than said length and together have a shaped end portion extending over a portion of said length in which said width gradually reduces to zero at that end thereof.

10. The arrangement of claim 1 wherein said magnetoresistive sensing memory storage cell has a magnetized body positioned adjacent thereto.

11. The arrangement of claim 1 wherein said enclosure is formed by an electrically insulative solid material body with said interior space limited to what is encapsulated therein which includes said magnetoresistive sensing memory storage cell and said magnet.

12. The arrangement of claim 11 wherein said magnetoresistive sensing memory storage cell is formed in a monolithic integrated circuit positioned in said interior space.

13. The arrangement of claim 11 further comprising a portion of a layer of magnetically permeable material positioned adjacent said magnetoresistive sensing memory storage cell.

14. The arrangement of claim 11 further comprising another magnetoresistive sensing memory storage cell positioned in or near said protected item in said enclosure having a magnetoresistance versus externally applied magnetic field characteristic with two states of differing resistive values which are each entered from that other by applying an external magnetic field having a magnitude change exceeding a magnitude difference between a pair of relatively small transition field value magnitude intervals each having externally applied magnetic field values occurring therein of a common field direction but with those externally applied magnetic field values occurring therein differing in magnitudes from those in that other transition field value magnitude interval.

15. The arrangement of claim 14 wherein said magnetic field of initial magnitudes provided by said magnet is about both said magnetoresistive sensing memory storage cells.

16. The arrangement of claim 15 further comprising a conductor coiled adjacent to both said magnetoresistive sensing memory storage cells such that any electrical current extablished through said conductor tends to place them in opposite resistive value states.

17. The arrangement of claim 11 wherein said magnetoresistive sensing memory storage cell has a length along a selected direction and a width substantially perpendicular thereto that is smaller in extent than said length and together have a shaped end portion extending over a portion of said length in which said width gradually reduces to zero at that end thereof.

18. The arrangement of claim 11 wherein said magnetoresistive sensing memory storage cell has a magnetized body positioned adjacent thereto.

* * * * *